(12) United States Patent
Monnet et al.

(10) Patent No.: US 6,717,149 B1
(45) Date of Patent: Apr. 6, 2004

(54) COMPACT DETECTION DEVICE FOR A GAMMA CAMERA

(75) Inventors: Olivier Monnet, Tullins (FR); Corinne Mestais, La Terrasse (FR); Jean-Pierre Rostaing, La Côte-Saint-André (FR); René Dupre, Massy (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/958,139
(22) PCT Filed: Apr. 27, 2000
(86) PCT No.: PCT/FR00/01125
§ 371 (c)(1), (2), (4) Date: Oct. 5, 2001
(87) PCT Pub. No.: WO00/67328
PCT Pub. Date: Nov. 9, 2000

(30) Foreign Application Priority Data

Apr. 30, 1999 (FR) .............................. 99 05527

(51) Int. Cl.⁷ ................................................ G01T 1/24
(52) U.S. Cl. .......................... 250/370.09; 250/370.01; 250/370.08
(58) Field of Search ..................... 250/370.01, 370.07, 250/370.08, 370.09, 370.1, 370.14, 371, 370.06

(56) References Cited

U.S. PATENT DOCUMENTS 5,381,014 A    1/1995   Jeromin et al.
5,742,060 A    4/1998   Ashburn
6,403,964 B1 *  6/2002   Kyyhkynen ............ 250/370.09

FOREIGN PATENT DOCUMENTS

EP       0657938        6/1995
EP       0872896        10/1998
WO      WO 96-20412     7/1996

OTHER PUBLICATIONS

M. Arques, et al., "A basic component for ISGRI, the CdTe Gamma Camera on Board the Integral Satellite" Paper presented at Toronto 1998 IEEE NSS conference, 6 Pages.

* cited by examiner

Primary Examiner—Constantine Hannaher
Assistant Examiner—Timothy Moran
(74) Attorney, Agent, or Firm—Thelen Reid & Priest LLP

(57) ABSTRACT

A compact detection device for a gamma camera comprises:
- several detectors (4a, 4b, . . . ) adjacent to each other to form a detection plane (4);
- a first ceramic substrate (1);
- a second substrate (3) on which the detectors are arranged;
- means (10b) of polarizing the detection plane and the signal processing means (10c) for the signal detected by the said detection plane, located in the first substrate; and
- a ground plane (2) placed between the first and the second substrates.

6 Claims, 2 Drawing Sheets

COMPACT DETECTION DEVICE FOR A GAMMA CAMERA

FIELD OF THE INVENTION

The invention relates to a compact detection device, for example to be used in gamma cameras. This device has applications in many fields, and particularly in nuclear medicine.

STATE OF THE ART

Gamma cameras are frequently used in the nuclear medicine field, and detection devices for these gamma cameras comprise a set of detectors adjacent to each other forming a detection plane supported by a substrate, each detector being connected to an electronic device for processing of the detected signal. For example, this type of device is described in patent application WO-96/20412. However, with this type of device, each gamma ray is identified solely by its amplitude and information is stored in the form of a voltage.

Other types of detection devices are known in the more general field of gamma cameras. In particular, one known technique is to use a detection device comprising several detectors placed side by side on a ceramic substrate, to form a detection plane. The ceramic substrate is designed to provide the mechanical strength of the overall device.

This type of detection device cannot operate unless it is polarized. This is achieved by providing the device with polarization means such as a resistance and a connecting capacitor; the resistance is grounded when the detector is connected to high voltage, and vice versa. These polarization means are placed on the surface of the ceramic substrate.

This detection device also comprises signal processing means for signals originating from detectors; these processing means are in the form of an ASIC (Application Specific Integrated Circuit) deposited on the substrate.

In this known detection device, the ceramic substrate is thin so that it is transparent to gamma rays that must be detected in the detection plane under the substrate. The substrate is thin such that the measurement ASIC can be located as close as possible to the detection plane, to minimize parasite capacitances on the link between the detection plane and the ASIC input.

Furthermore, it is known that polarization means for this type of device must be located on the shortest path between the detection plane and the ASIC. Furthermore, since the substrate is thin, the resistance and the polarization capacitor are implanted on the substrate surface by silk screen printing.

In particular, this type of detection device is described in the publication entitled: "A Basic Component for ISGRI, the CdTe gamma camera onboard the INTEGRAL Satellite" by M. ARQUES et al. The detection device described in this publication is applied to a satellite. In this particular case, the detection device comprises two detection stages for two energy ranges. A measurement ASIC is installed on this detection device to be close to the detectors in order to minimize parasite capacitances of the link between the detectors and the ASIC input. In this device, noise related to signal processing electronics used for the detected signals hinders detection of the signals. Furthermore, this noise may be high compared with the very low measured electrical charges. Furthermore, the noise and the signal to be measured are synchronous. Consequently, the measurement times and electronic processing times are sequenced; the signal processing electronics is inhibited during the photon measurement time. The measurement is memorized and then processed. If a photon appears on the detector during the processing time, it will be ignored. This operating method is particularly penalizing in nuclear medicine.

Many technical domains require the use of a gamma camera to efficiently detect signals with an amplitude similar to the amplitude of electronic noise. In this case, it is necessary to protect detectors from electronic disturbances caused by the detected signal processing electronics. In particular, this is the case in the field of nuclear medicine using semiconductor based detectors in which the signals to be detected are of the order of magnitude of a femto Coulomb.

In this case, the expert in the subject would typically use a ground plane to protect detectors from disturbances caused by electronic noise. However, adding a ground plane between the ceramic substrate and detectors creates a problem with the parasite capacitance added by this gamma plane that must have the smallest possible effect on the signal.

Furthermore, adding a ground plane between the ASIC and the detector on a conventional detection device as described previously, would increase the signal noise since the ceramic substrate on which the ASIC is fixed is thin.

Furthermore, an expert in the subject knows that the resistance/capacitor assembly must be placed on the shortest path between the detector and the ASIC. But it must not be located on the ground plane since the ground plane must be uniform. Furthermore, this resistance/capacitor assembly cannot be located in the ASIC due to parasite capacitances caused by the integration of components, and cannot be inserted between the detectors.

In the medical field, it is important that the detection device comprising the processing electronics should be as compact as possible with no dead areas (area not used for detection).

PRESENTATION OF THE INVENTION

The purpose of the invention is to correct these disadvantages. Consequently, it proposes a compact detection device for a gamma camera to enable detection of signals with the order of magnitude of a femto Coulomb by introducing a ground plane inserted between two ceramic substrates.

More precisely, the invention relates to a compact detection device, for example for a gamma camera, comprising:

several detectors adjacent to each other to form a detection plane; and a first ceramic substrate, characterized in that it comprises;

a second substrate on which the detectors are arranged;

means of polarizing the detection plane and the signal processing means for signals detected by the said detection plane, located in the first substrate; and a ground plane placed between the first and the second substrates.

According to the invention, the second substrate may be made from a thick ceramic, the thickness of this ceramic being chosen so as to achieve a compromise between the quality of its mechanical strength and the parasite capacitance generated between the detection plane and the ground plane.

According to the invention, the first ceramic substrate may be thick so that it has a low permittivity and good mechanical properties.

Advantageously, the polarization means are integrated into the first substrate by a surface-mounted components assembly process.

Several compact detection devices may be placed adjacent to each other to make a large detection device without any dead areas.

PRESENTATION OF EMBODIMENTS OF THE INVENTION

Figure 1:
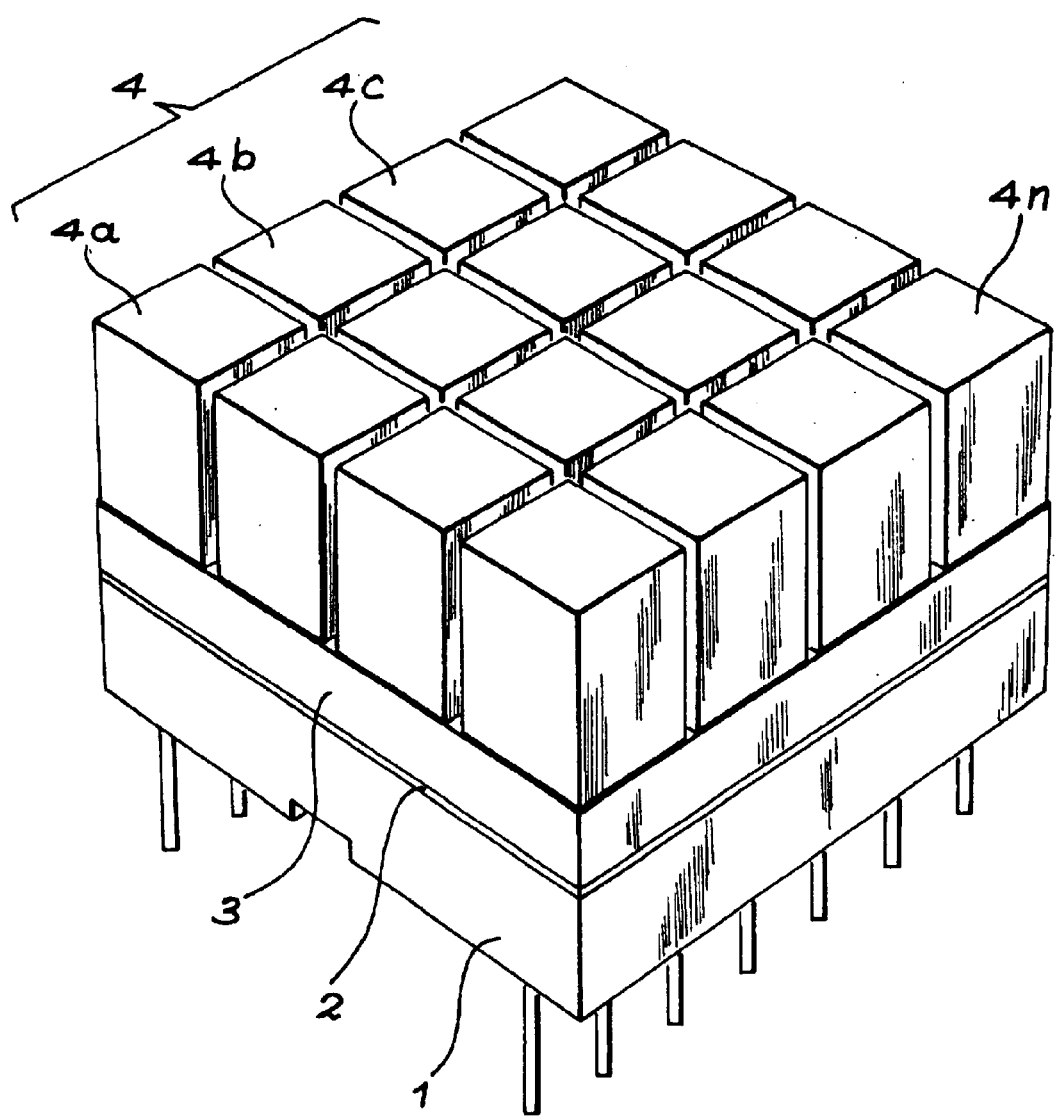
FIG. 1 diagrammatically shows the detection device according to the invention.

FIG. 1 diammatically shows the compact detection device conforming with the invention, for examples for use with a gamma camera.

This detection device comprises several detectors 4a, 4b, 4c, . . . , 4n placed adjacent to each other to form a detection plane 4.

These detectors are preferably made of CdZnTe and form the pixels in the detection device.

These detector pixels are assembled by gluing or by welding on the electrical contacts of the second substrate, reference 3.

These detector pixels directly convert the energy in the gamma photons into charge carriers. Charge carriers are collected by means of contacts deposited on each pixel (not in the figure for reasons of clarity), to which a high polarization voltage is applied. The signal is read on the polarization resistance of each channel, through a connecting capacitance.

According to the invention, the second substrate 3 is made from a co-sintered multi-layer ceramic, known for its good mechanical tolerances, and that can be thick.

The thickness of this second substrate 3 is chosen to achieve a compromise between the quality of the mechanical resistance of the substrate and the parasite capacitance that it generates. In particular, the function of this second substrate 3 is to shield the detectors against noise.

This type of substrate 3 has good mechanical strength and good resistance to temperature and humidity; therefore it is easy to assemble the detectors to be as close to each other as possible in order to not leave any dead area, and thus to give a good quality image. Good precision in positioning each of the detectors in the detection plane avoids creating artefacts on the acquired image at the output from the gamma camera.

The device according to the invention also comprises a first substrate 1 separated from the substrate 3 by a ground plane 2.

Advantageously, the substrate 1 is made from the same material as substrate 3.

The two substrates 1 and 3 are mechanically and electrically assembled together.

The first substrate 1 comprises detector polarization means such as a resistance and a capacitor, that are identical to those used in prior art described above. This first substrate also includes signal processing means called "ASICs", for processing signals produced by the detectors.

According to the invention, this first co-sintered multi-layer ceramic substrate is thick. It also has good mechanical strength properties, namely good resistance to temperature and good resistance to humidity, unlike for example epoxy type substrates.

However, since this first substrate 1 is thick and is made from a co-sintered multi-layer ceramic (which makes it impossible to use the silk screen printing process), it is impossible to make polarization means (the capacitor and the resistance) on this substrate using conventional silk screen printing processes. Furthermore, according to the invention, the capacitor and the polarization resistance are integrated into cavities 10a made in the substrate 1, using a surface-mounted components (SMC) technique. This production technique is widely used for printed circuits and is described, for example, in a commercial document published by SIEMENS® entitled "the CMS technique-introduction to surface mounting".

Processing means for signals output from a detectors, or ASICs, are also implanted in the substrate 1 using a conventional electronic packaging technique.

Figure 2A:
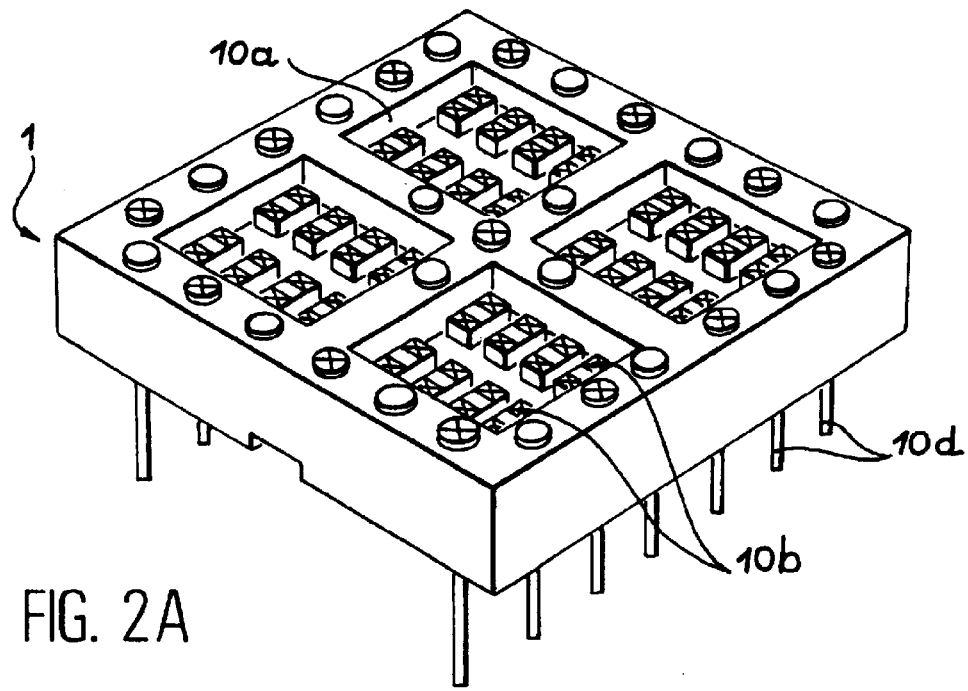
FIG. 2A diagrammatically shows a top view of the first substrate in the device according to the invention.
Figure 2B:
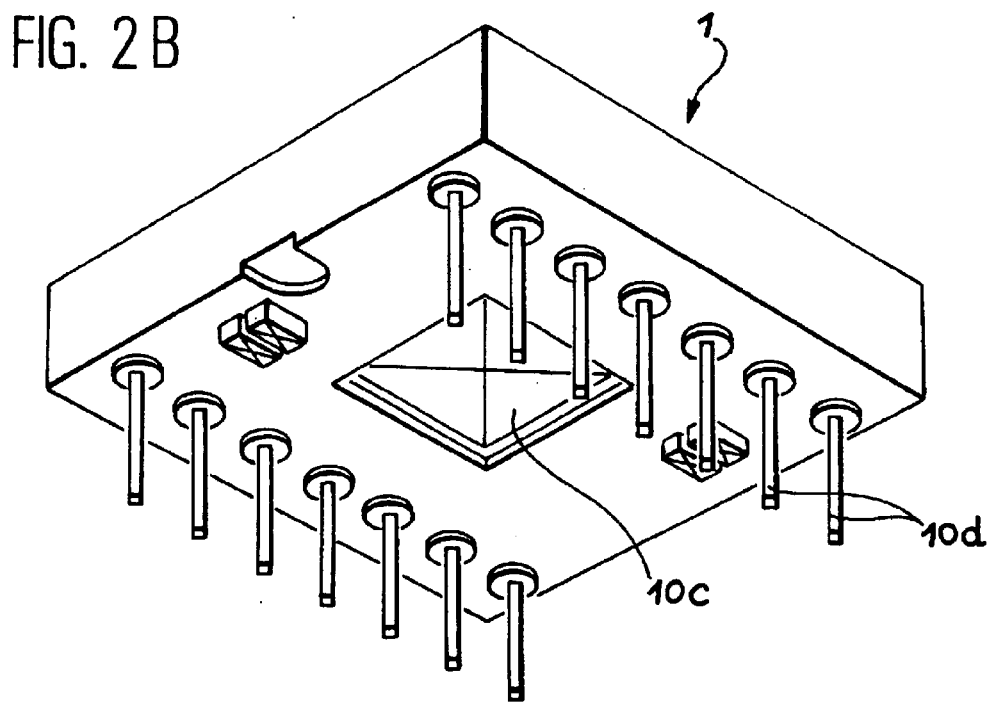
FIG. 2B shows a bottom view of the first substrate in the detection device according to the invention.

FIGS. 2A and 2B show a top view and a bottom view respectively of the first substrate 1 of the device according to the invention. FIG. 2A shows the substrate 1 with cavities 10a inside which polarization components 10b, namely capacitors and resistances, are located.

In FIG. 2B, the same substrate 1 is shown on which the ASIC reference 10c is implanted. This figure also shows the detection device output connections 10d.

A ground plane 2 is placed between the first substrate 1 and the second substrate 3; this ground plane is composed of a metallic layer at a chosen voltage, identical over its entire surface. The function of this ground plane is to protect the signals to be detected from electromagnetic disturbances caused by electronic noise generated by the device.

The device according to the invention comprises a number of detectors on each substrate, that varies as a function of the optimisation of the dimensions of the detectors, and polarization and signal processing components. For example, the detection plane shown in FIG. 1 contains 16 detectors.

Several compact detection devices may be placed adjacent to each other to form a large detection device without any dead area.

A detection device like that described above could actually be considered as a detection device with a substrate used in its three dimensions:

the first two dimensions having a sufficient mechanical strength to enable adjacent and precise positioning of the detectors; and the third dimension being used firstly to put the shielding at a sufficient distance to separate detectors from the ground plane while minimising the parasite capacitance produced, and secondly to form sufficiently deep cavities to embed polarization and signal processing components in the substrate. Thus, this type of device would thus not have any dead areas.

Thus, although the ASIC is remote from the detection plane, detection of signals by means of a detection device according to the invention could give good quality signals since the detectors are isolated from electronic noise by the ground plane.

Furthermore, the fact of using a second thick substrate 3 can reduce parasite capacitances between the detector plane and the ground plane, since they are sufficiently remote from the ground plane.

What is claimed is:

1. Compact detection device comprising:
several detectors (4a, 4b, . . . ) adjacent to each other which form a detection plane (4); and
a substrate assembly comprising:
  a first ceramic substrate (1);
  characterized in that it comprises:
    a second substrate (3) separated from the first ceramic substrate (1) and having electrical contacts on which the detectors are arranged, said second substrate and said first substrate being mechanically and electrically assembled together;
    means (10b) for polarizing the detection plane and means (10c) for processing signals detected by the detection plane, said means for polarizing and means for processing located in said first ceramic substrate; and
    a ground plane (2) placed between said first ceramic substrate and said second substrate to protect the detected signals from electromagnetic disturbances caused by the electronic noise generated by the device.

2. Detection device according to claim 1, characterized in that said second substrate is made from a ceramic substrate.

3. Detection device according to claim 1, characterized in that the polarization means are integrated into the first substrate by an SMC surface mounting process.

4. Large dimension detection device, characterized in that it comprises several compact detection devices according to claim 3, adjacent to each other with no dead areas.

5. Large dimension detection device, characterized in that it comprises several compact detection devices according to claim 1, adjacent to each other with no dead areas.

6. Detection device according to claim 1, characterized in that the polarization means are integrated into the first substrate by an SMC surface mounting process.

* * * * *